United States Patent
Shimada et al.

(10) Patent No.: US 7,967,917 B2
(45) Date of Patent: Jun. 28, 2011

(54) METHOD OF CLEANING STORAGE CASE

(75) Inventors: Shu Shimada, Tokyo (JP); Noriyuki Takahashi, Tokyo (JP); Hiroyuki Nakajima, Tokyo (JP); Hiroko Tanaka, Tokyo (JP); Nobuyuki Kanda, Tokyo (JP)

(73) Assignee: Dai Nippon Printing Co., Ltd., Takyo-to (JP)

( * ) Notice: Subject to any disclaimer, the term of this patent is extended or adjusted under 35 U.S.C. 154(b) by 189 days.

(21) Appl. No.: 11/839,626

(22) Filed: Aug. 16, 2007

(65) Prior Publication Data
US 2009/0007939 A1 Jan. 8, 2009

(30) Foreign Application Priority Data

Aug. 24, 2006 (JP) ................................ 2006-227246

(51) Int. Cl.
*B08B 5/02* (2006.01)
*B08B 9/093* (2006.01)

(52) U.S. Cl. ............ 134/37; 134/19; 134/21; 134/22.18
(58) Field of Classification Search .................... 134/37, 134/21, 22.18, 19
See application file for complete search history.

(56) References Cited

U.S. PATENT DOCUMENTS

| 5,238,503 | A | | 8/1993 | Phenix et al. | |
| 5,991,965 | A | * | 11/1999 | Stroh et al. | 15/310 |
| 6,770,109 | B2 | * | 8/2004 | Tanaka et al. | 55/385.6 |

FOREIGN PATENT DOCUMENTS

| EP | 0813230 | | 12/1997 |
| JP | 2002110759 A | * | 4/2002 |
| JP | 2004-053817 | | 2/2004 |
| JP | 2006-011048 | | 1/2006 |

* cited by examiner

*Primary Examiner* — Michael Kornakov
*Assistant Examiner* — Natasha Campbell
(74) *Attorney, Agent, or Firm* — Ladas & Parry LLP

(57) ABSTRACT

The present invention provides a method of cleaning a storage case to be used for storing or transporting mask substrates such as photomasks and photomask blanks, semiconductor substrates such as semiconductor wafers, pellicles, or the like. The present invention: facilitates a regular cleaning operation, can be used also for a storage case of a complicated shape, does not require a large scale equipment or an expensive equipment to facilitate an environmental countermeasure, and provides high cleaning effect. The method of cleaning a storage case polluted by adhesion of a foreign substance of an organic material, an ionic foreign substances or an ionic crystal foreign substance physically absorbed, comprises a step of placing the storage case still in air flow of cleaned air or an inert gas in a temperature range from room temperature to 80° C. for desorbing and removing the foreign substance adhered to the storage case.

9 Claims, 1 Drawing Sheet

METHOD OF CLEANING STORAGE CASE

BACKGROUND OF THE INVENTION

1. Field of the Invention

The present invention relates to a method of cleaning a storage case to be used for storing or transporting mask substrates such as photomasks and photomask blanks, semiconductor substrates such as semiconductor wafers, pellicles, or the like.

2. Description of the Related Art

Recently, with the trend of the miniaturization and the high integration of semiconductor devices, wavelength of the light source of the exposing apparatus, used in photolithography techniques for the pattern formation has become shorter from the g line of a high pressure mercury lamp (436 nm) and the i line (365 nm), to the KrF excimer laser (248 nm), and the ArF excimer laser (193 nm). Since such exposing light sources of shorter wavelengths have high output with short wavelengths, the light energy is high, and thereby they cause a phenomenon where foreign substances are grown on photomasks or wafers used for the exposure as the time advances. It is pointed out that the growing of the foreign substances is more prominent as the wavelength of the exposing light becomes shorter. As the foreign substances generated on the photomasks become so large that they are transferred onto wafers, breakages of the circuit of the semiconductor devices or short circuit is caused, and thus it has been problematic.

As one of the major factors to generate the growing foreign substances on the photomasks at the time of using a short wavelength exposing light source, it is said that reaction of a sulfuric acid ion present on the mask surface as an acidic substance, and a basic substance such as ammonium present in the mask use-environment are accelerated by the excimer laser irradiation upon the pattern transfer so as to generate ammonium sulfide, or the like for providing the foreign substances (see, for example, Japanese Patent Application Laid Open Nos. 2006-11048, and 2004-53817).

In the semiconductor device production, reduction in defects of the photomasks or the semiconductor wafers is the essential task for ensuring a high yield. Accordingly, storage cases for storing cleaned photomasks with a purified surfaces or semiconductor wafers, and pellicles to be mounted on photomasks are mostly designed to prevent the stored subjects from being polluted with the dusts or the pollutants generated from the case constituent materials or the environment used therein.

For preventing the pollution of the above-mentioned mask substrates, the semiconductor substrates, or the pellicles with the ionic foreign substances, not only the mask substrates, the semiconductor substrates and the pellicles but also the storage cases should be cleaned regularly. As to the storage cases, in general, a method of washing by a wet process using such as hot water, a detergent-containing aqueous solution, or an acid is used. However, in the case of a storage case having a complicated shape, a problem arises in that the corner portion, or the like of the case cannot be washed sufficiently and it is hard to dry. Moreover, in the case a metal part is used for the case material, there is a problem in that acid, or the like cannot be used as the washing solution so that it is not easy to wash the case. Furthermore, since large scale equipments are required including the environmental countermeasure for the washing operation using a solvent, it leads to the production cost increase, and thus it has been problematic.

Therefore, in the case the shape of the storage case is complicated, or a metal part is used, since the cleaning operation by the conventional washing method is difficult, the storage case is used continuously as it is so as to lower the yield of the device production, or the case is replaced by a new one so as to bring about the production cost increase, and thus it has been problematic.

SUMMARY OF THE INVENTION

Therefore, the present invention has been achieved in view of the above-mentioned problems. An object of the present invention is to provide a method of cleaning a storage case to be used at the time of storing or transporting mask substrates such as photomasks and photomask blanks, semiconductor substrates such as semiconductor wafers, pellicles, or the like: facilitating a regular cleaning operation; to be also used for storage cases of complicated shapes; which does not require a large scale equipment or an expensive equipment; which has the easy environmental countermeasure and high cleaning effect.

The present inventors have found out that one of factors of the above-mentioned foreign substance generation to the mask substrate, the semiconductor substrate, or the like at the time of storing the storage case is attributed the followings. Ions of such as sulfuric acid used in washing the storage case are adsorbed to the internal surface of the storage case and then to be desorbed over time to be transferred and adhered on the surface of the photomask and others, or ions of such as sulfuric acid or an organic material present in the atmosphere of the storage case use environment are taken into the case so as to be desorbed to adhere on the surface of the photomask and others. The ions are then reacted with ammonia, or the like in the atmosphere to produce ionic crystal foreign substances of such as ammonium sulfate, ionic foreign substances, or foreign substances of an organic material for polluting the photomask and others. The present inventors have completed the present invention by using dry cleaning instead of conventional wet cleaning as a method of cleaning to prevent the pollution.

In order to solve the above-mentioned problems, a method of cleaning a storage case according to a first aspect provides a method of cleaning a storage case polluted by adhesion of a foreign substance of an organic material, an ionic foreign substance or an ionic crystal foreign substance physically absorbed, comprising a step of placing the above-mentioned storage case still in the air flow of cleaned air or an inert gas in a temperature range from room temperature to 80° C. for desorbing and removing the above-mentioned foreign substances adhered on the storage case.

A method of cleaning a storage case according to a second aspect of the present invention is the method of cleaning a storage case according to the first aspect, wherein the above-mentioned ionic foreign substance includes: an anion selected from the group consisting of a sulfuric acid ion, a nitric acid ion, a hydrochloric acid ion, and an oxalate ion; or a cation selected from the group consisting of a sodium ion and an ammonium ion.

A method of cleaning a storage case according to a third aspect of the present invention is the method of cleaning a storage case according to the first aspect, wherein the above-mentioned ionic crystal foreign substance includes any one selected from the group consisting of ammonium sulfate, ammonium nitrate, ammonium chloride, ammonium oxalate, and sodium chloride.

A method of cleaning a storage case according to a fourth aspect of the present invention is the method of cleaning a storage case according to any one of the first to third aspects, wherein the above-mentioned cleaned air or inert gas is the one passed through a chemical filter for removing an acidic ion, a chemical filter for removing an alkaline ion, and a chemical filter for removing an organic material.

A method of cleaning a storage case according to a fifth aspect of the present invention is the method of cleaning a storage case according to any one of the first to fourth aspects, wherein the above-mentioned cleaned air or inert gas is of the air volume in the range of 30 $m^3$/minute to 200 $m^3$/minute.

A method of cleaning a storage case according to a sixth aspect of the present invention is the method of cleaning a storage case according to any one of the first to fifth aspects, wherein the above-mentioned ionic foreign substance or ionic crystal foreign substance includes a sulfuric acid ion, and the adhered amount of the sulfuric acid ion remaining on the storage case surface after the desorbing and removing of the foreign substance is 20 $ng/cm^2$ or less.

Since the method of cleaning a storage case of the present invention is for cleaning a case with the cleaned air or inert gas but not with a solvent, the following effects are obtained. The present invention facilitates the environmental countermeasure because a large scale equipment or an expensive equipment is not needed; can be used for a storage case of a complicated shape; and facilitates the regular storage case cleaning operation to enable the long term utilization or reuse of the case.

Furthermore, the effect of improving the yield of a stored substance or a product using a stored product is achieved by improving the quality of the stored substance with good cleaning effect produced by cleaning a storage case vulnerable to the ion generation.

DESCRIPTION OF THE PREFERRED EMBODIMENTS

Figure 1:
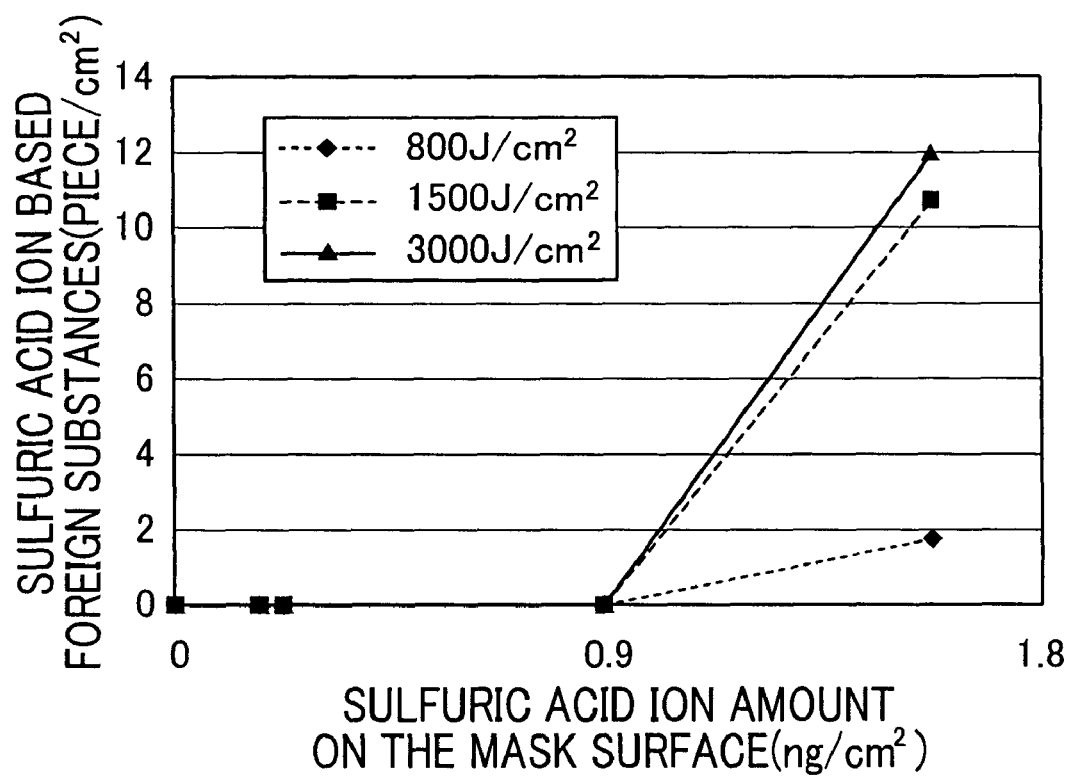
FIG. 1 is a graph showing the relationship between the residual sulfuric acid ion amount on the photomask and the number of the generated foreign substances concerning a method of cleaning a storage case of the present invention.

Hereinafter, embodiments of a method of cleaning a storage case of the present invention will be explained.

The present invention provides a method of cleaning a storage case polluted by adhesion of a foreign substance of an organic material, an ionic foreign substance or an ionic crystal foreign substance physically absorbed, comprising a step of placing the storage case still in the air flow of cleaned air or an inert gas in a temperature range from room temperature to 80° C. for desorbing and removing the above-mentioned foreign substance adhered to the storage case.

In the present invention, as examples of the above-mentioned foreign substance of an organic material physically absorbed, dioctyl phthalate, dibutylphthalate, ester propionate, or a siloxane based organic material can be presented. As the above-mentioned ionic foreign substance, one including an anion selected from the group consisting of a sulfuric acid ion, a nitric acid ion, a hydrochloric acid ion, and an oxalate ion, or a cation selected from the group consisting of a sodium ion and an ammonium ion can be presented. Moreover, as the above-mentioned ionic crystal foreign substance, one including any one selected from the group consisting of ammonium sulfate, ammonium nitrate, ammonium chloride, ammonium oxalate, and sodium chloride can be presented. Among these examples, ammonium sulfate is representative.

As the material for a storage case for a pellicle, a semiconductor substrate, or a mask substrate such as a glass substrate for a mask blank, a mask blank and a photomask, one having the impact resistance, low dusting characteristics and photo resistance, which can be washed easily with a good drying properties, and which can be reused is preferable. For example, a polymer resin such as polyethylene, polypropylene, polycarbonate, polyacetal, polybutylene terephthalate, and an ABS resin are used. For improving the strength, a metal may be used partially for these storage cases. Since the cleaning method of the present invention is dry cleaning using the air or an inert gas, it can be applied without causing any damage for any material including a metal or a resin which has a poor chemical resistance against the wet cleaning using a liquid. Furthermore, a storage case of a complicated shape can also be washed sufficiently regardless of the shape.

As the cleaned air or the inert gas to be used for the cleaning method of the present invention, air having passed through a HEPA filter, a nitrogen gas, and a rare gas such as He and Ne, can be used. In terms of the cost, air or a nitrogen gas is more preferable. As to the air or the inert gas, for preventing further adhesion of the foreign substance of an organic material, the ionic foreign substance or the ionic crystal foreign substance, it is preferable that air or the inert gas has passed through a chemical filter for removing an acidic ion, a chemical filter for removing an alkaline ion, and a chemical filter for removing an organic material.

As the chemical filter, a chemical filter using active carbon particles or active carbon fibers effective for the organic materials, a chemical filter with an acid or an alkaline added thereto, or a chemical filter using an ion exchanger can be used. As the chemical filter using an ion exchanger, one having a high removing ratio of a gas component of a ppb level is suitable, and one processed into a non-woven fabric or a woven fabric is suitable because of its light weight and facilitation of a molding process. As to the ion exchange group, a chemical filter using a cation exchange group such as a sulfonic acid group and a carboxyl group for removing an alkaline ion, and a chemical filter using an anion exchange group such as a quaternary ammonium group and a tertiary amino group for removing an acidic ion can be used.

As to the air volume of the air flow of the cleaned air or the inert gas used for cleaning, a range of 30 $m^3$/minute to 200 $m^3$/minute, which is higher than an ordinary down flow rate, and the blow out air volume in a range of about 0.3 m/second to 2.0 m/second is preferred, since the desorption reaction of the foreign substance is better-facilitated with a higher air volume. If the air volume is lower than 30 $m^3$/minute, the cleaning force for desorbing and removing the foreign substance gets weak. On the other hand, if the air volume is higher than 200 $m^3$/minute, the cost is increased to maintain the large flow rate. As to the path of the air flow, it may be provided to the storage case either in the horizontal or vertical direction. Therefore, the above-mentioned chemical filter may be mounted on a clean bench.

The storage case is washed in a state placed still in the air flow in the temperature range of room temperature (temperature in a general clean room: 23° C.) to 80° C. The cleaning temperature can be controlled by providing a heating part in the air flow piping system. In the case of the room temperature, although the cleaning system can easily be administered, the cleaning force is slightly low. On the other hand, in the case of the high temperature, although the cleaning force is improved, the administration cost for the cleaning system is increased. Since the cleaning effect is insufficient at a temperature lower than the room temperature and the storage case is deteriorated at a temperature higher than 80° C., and these conditions are not preferable. At the time of the cleaning operation, the storage case is placed still in a state with the upper lid opened so that the air flow of the cleaned air or the inert gas is supplied sufficiently to the inside of the case.

The present inventors have found out by an experiment the threshold value to generate the foreign substance with the ArF laser exposure amount ($8\times10^3$; $15\times10^3$; $30\times10^3$ J/cm$^2$) with respect to the sulfuric acid concentration on the mask surface in the case a photomask stored in a storage case is polluted by a sulfuric acid ion desorbed from the storage case. FIG. 1 shows the results. The concentration measurement of the sulfuric acid ion on the mask surface was obtained by: extracting with pure water the ions present on the surface of the targeted mask, and carrying out the quantitative analysis with the ion chromatography method of the pure water solution of the extracted ions. In this case, the extraction was carried out while heating the pure water.

FIG. 1 is a graph with the residual sulfuric acid ion amount (ng/cm$^2$) on the mask plotted in the lateral axis, and the number of the foreign substances (pieces/cm$^2$) plotted in the vertical axis. In the case the residual sulfuric acid ion amount on the photomask is 1 ng/cm$^2$ or more, foreign substances were generated regardless of the ArF laser exposure amount. Therefore, the threshold value of the sulfuric acid ion amount to generate the foreign substance derived from the sulfuric acid ion on the mask surface is 1 ng/cm$^2$ or more.

Moreover, it was confirmed that the sulfuric acid ion amount on the mask surface is increased by about 0.1 ng/cm$^2$/week when a photomask is stored in a polluted storage case. About 500 ng/cm$^2$ of the sulfuric acid ion was adhered on the surface of the polluted storage case. In this case, the sulfuric acid ion amount of the mask surface is presumed to exceed the threshold value 1 ng/cm$^2$ in 9 weeks.

Therefore, in preventing the case from the pollution of the stored photomask derived from the desorption of the sulfuric acid ion, the residual sulfuric acid ion amount (ng/cm$^2$) of the substrate storage case for storing a clean mask should be 20 g/cm$^2$ or less for storing the mask without exceeding the threshold value for 6 months (24 weeks) or longer, and it is more preferably 10 ng/cm$^2$ or less in terms of the administration.

Although the present invention has been explained with an example of a substrate storage case for a photomask so far, the present invention is for cleaning the pollutant adsorbed to the storage case by placing the case still in the air flow of the cleaned air or the inert gas to forcibly desorb and remove the pollutant. Since the cleaning method of the present invention is the dry process with no solvent used, it can be used for storage cases of not only a mask substrate, a semiconductor substrate or a pellicle but also various substances to be stored.

Hereafter, it will be explained in further detail with reference to the example.

Examples

As the storage case for storing a photomask, a SMIF (standard Mechanical Interface) case cleaned by a cleaning method not using a sulfuric acid ion was used. A clean photomask with no adhesion of a sulfuric acid ion on the surface was stored in the storage case and the same was optionally and repeatedly taken out from the case for carrying out the ArF excimer laser exposure and returned to the case after the exposure.

Initially, adhesion of the sulfuric acid ion was analyzed by the ion chromatography method so that no adhesion of the sulfuric acid ion was confirmed both for the storage case and the photomask.

However, with the cumulative exposure time, since the sulfuric acid ion presented in the use environment was adsorbed gradually by the SMIF case, and then the sulfuric acid ion adsorbed on the internal surface of the SMIF case was also desorbed so as to be transferred onto the surface of the photomask stored in the SMIF case, growing foreign substance generation was to be observed on the photomask.

Subsequently, the polluted SMIF case was placed still in a state with the upper lid opened, in the cleaned air flow (flow rate: 30 m$^3$/minute) which had passed through a HEPA filter, a chemical filter using an ion exchanger having a cation exchange group and an anion exchange group and a chemical filter using active carbon particles, at room temperature (23° C.) for 24 hours for dry cleaning with the cleaned air. As a result, the sulfuric acid ion adsorbed on the storage case was practically desorbed and removed. As a result of the residual sulfuric acid ion concentration analysis of the SMIF case by the ion chromatography method, the residual sulfuric acid ion adhered amount was less than 1 ng/cm$^2$ based on the adhered amount per unit area of the substrate.

A photomask separately washed and having a cleaned surface was stored in the dry-cleaned SMIF clean case. Then pollution of the photomask surface with the growing foreign substances was not observed. Furthermore, by regularly carrying out the above-mentioned cleaning method of the SMIF case, recurrence of the pollution of the photomask by the foreign substance derived form the pollution of the storage case was prevented.

What is claimed is:

1. A method of cleaning a storage case polluted by adhesion of a foreign substance of an organic material, an ionic foreign substance or an ionic crystal foreign substance physically absorbed, comprising the steps of
    opening the storage case in a clean room;
    providing in the clean room an air flow of clean air or an inert gas in a temperature range from room temperature to 80° C.:
    controlling the temperature of the air flow with a heating part provided in an air flow piping system;
    placing the storage case in the air to desorb and remove the foreign substance adhered to the storage case.

2. The method of cleaning a storage case according to claim 1, wherein the ionic foreign substance includes: an anion selected from the group consisting of a sulfuric acid ion, a nitric acid ion, a hydrochloric acid ion, and an oxalate ion; or a cation selected from the group consisting of a sodium ion and an ammonium ion.

3. The method of cleaning a storage case according to claim 1, wherein the ionic crystal foreign substance includes any one selected form the group consisting of ammonium sulfate, ammonium nitrate, ammonium chloride, ammonium oxalate, and sodium chloride.

4. The method of cleaning a storage case according to claim 1, wherein the cleaned air or the inert gas is cleaned air or an inert gas passed through a chemical filter for removing an acidic ion, a chemical filter for removing an alkaline ion, and a chemical filter for removing an organic material.

5. The method of cleaning a storage case according to claim 2, wherein the cleaned air or the inert gas is cleaned air or an inert gas passed through a chemical filter for removing an acidic ion, a chemical filter for removing an alkaline ion, and a chemical filter for removing an organic material.

6. The method of cleaning a storage case according to claim 1, wherein the cleaned air or the inert gas is of a flow rate in a range of 30 m$^3$/minute to 200 m$^3$/minute.

7. The method of cleaning a storage case according to claim 2, wherein the cleaned air or the inert gas is of a flow rate in a range of 30 m$^3$/minute to 200 m$^3$/minute.

8. The method of cleaning a storage case according to claim 1, wherein the ionic foreign substance or the ionic crystal foreign substance includes the sulfuric acid ion, and the adhered amount of a sulfuric acid ion remaining on the storage case surface after the desorbing and removing of the foreign substance is 20 ng/cm$^2$ or less.

9. The method of cleaning a storage case according to claim 2, wherein the ionic foreign substance or the ionic crystal foreign substance includes the sulfuric acid ion, and the adhered amount of the sulfuric acid ion remaining on the storage case surface after the desorbing and removing of the foreign substance is 20 ng/cm$^2$ or less.

* * * * *